United States Patent [19]
Tseng

[11] Patent Number: 5,830,792
[45] Date of Patent: Nov. 3, 1998

[54] METHOD OF MAKING A STACK CAPACITOR IN A DRAM CELL

[75] Inventor: Horng-Huei Tseng, Hsinchu, Taiwan

[73] Assignee: Vanguard International Semiconductor Corporation, Hsinchu, Taiwan

[21] Appl. No.: 859,855

[22] Filed: May 21, 1997

[51] Int. Cl.⁶ ............................................. H01L 21/8242
[52] U.S. Cl. ........................ 438/254; 438/240; 438/397
[58] Field of Search .................... 438/238–240, 438/253–254, 396–397; 257/306, 309, 310

[56] References Cited

U.S. PATENT DOCUMENTS 5,266,512  11/1993  Kirsch ..................................... 438/396
5,374,580  12/1994  Baglee et al. ........................... 438/243
5,545,582   8/1996  Roh ......................................... 438/396

*Primary Examiner*—Joni Chang
*Attorney, Agent, or Firm*—Christensen, O'Connor, Johnson & Kindness PLLC

[57] ABSTRACT

A method of manufacturing a capacitor for use in semiconductor memories is disclosed. The present invention includes forming a silicon nitride layer as an oxidation mask to oxidize a polysilicon layer. Then, a anisotropic etching is used to etch the oxidized polysilicon layer. Next, a second polysilicon layer is formed on the resulting structure. Then, an anisotropically etching is used to etch the second polysilicon layer for forming side wall spacers. Then, the oxidized polysilicon layer is removed to leave the bottom storage node of a capacitor is formed having increased area.

19 Claims, 4 Drawing Sheets

METHOD OF MAKING A STACK CAPACITOR IN A DRAM CELL

FIELD OF THE INVENTION

The present invention relates to semiconductor capacitors, and more specifically, to a method of making a stacked capacitor for a DRAM cell.

BACKGROUND OF THE INVENTION

The earliest DRAMs (Dynamic Random Access Memory) used three-transistor cells and were fabricated using PMOS technology. However, DRAM cells consisting of only one transistor and one capacitor were quickly developed, and such cells have been used in DRAMs ever since. Great progress has been made in the manufacture of DRAMs using high density integrated circuit technology.

A memory cell for each bit to be stored by the semiconductor DRAM typically consists of a storage capacitor and an access transistor. Either the source or drain of the transistor is connected to one terminal of the capacitor. The other side of the transistor and the transistor gate electrode are connected to external connection lines called a bit line and a word line, respectively. The other terminal of the capacitor is connected to a reference voltage.

The formation of a DRAM memory cell comprises the formation of a transistor, a capacitor and contacts to external circuits. The capacitor type that has been typically used in DRAM memory cells is the planar capacitors, because they are relatively simple to manufacture. However, it has been a trend to increase the packaging density of memory cells. This large integration of DRAMs has been accomplished by a reduction in individual cell size. The reduction in cell size results in a decrease in storage capacitance leading to reliability drawbacks, such as a lower signal to noise ratio and undesirable signal problems. The desired large scale integration in DRAM devices along with reliable operation can be achieved by using DRAM storage capacitors with a high storage capacitance relative to its cell area.

As the capacity of DRAMs has increased, the sizes of the memory cells have steadily decreased. For very small memory cells, planar capacitors become very difficult to use reliably. Specifically, as the size of the capacitor decreases, the capacitance of the capacitor also decreases and the amount of the charge capable of being stored by the capacitor similarly decreases. Additionally, as the capacitance decreases, the charge held by storage capacitor must be refreshed relatively often. Further, this results in the capacitor being very susceptible to particle interference. A simple planar capacitor cannot provide sufficient capacitance, even with high dielectric $Ta_2O_5$ films as the capacitor insulator.

Prior art approaches to overcoming these problems have resulted in the development of the trench capacitor (see for example U.S. Pat. No. 5,374,580) and the stacked capacitor. The trench capacitor has the well-known problem of "gated diode leakage," which is the leakage of current resulting in the trench capacitor failing to hold a charge. Reducing the thickness of the dielectric also can improve the capacitance of the capacitor, but this approach is limited because of yield and reliability problems.

SUMMARY OF THE INVENTION

A method for manufacturing a capacitor on a semiconductor substrate is disclosed. The method comprises the steps of: forming a first polysilicon layer over said substrate; forming a first dielectric layer on said first polysilicon layer; forming a trench in said first polysilicon layer and in said first dielectric layer; thermally oxidizing said first polysilicon layer to form a silicon oxide layer along the surface of said trench using said first dielectric layer as a mask; removing said first dielectric layer; etching a portion of said first polysilicon layer using said silicon oxide layer as an etching mask; anisotropically etching said silicon oxide layer to the surface of said first polysilicon layer; forming a second polysilicon layer along the surface of said first polysilicon layer and said silicon oxide layer; anisotropically etching said second polysilicon layer to form sidewall spacers on the sidewalls of said silicon oxide layer; removing said silicon oxide layer, thereby forming a first storage node of said capacitor; forming a second dielectric layer on the surface of said first storage node of said capacitor; and forming a conductive layer along the surface of said second dielectric layer to act as a second storage node of said capacitor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The formation of the capacitor described herein includes many process steps that are well known in the art. For example, photolithography processes and etching processes are well known in the art and are used herein without a detailed discussion of these well known technologies.

Figure 1:
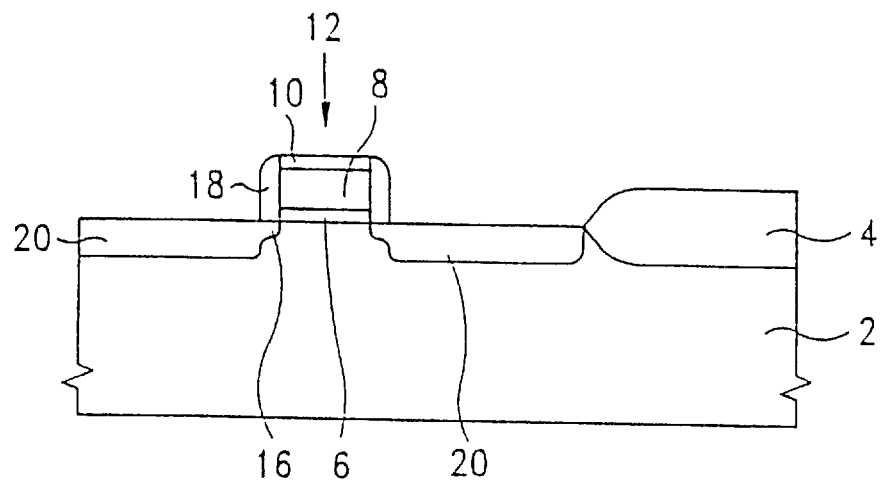
FIG. 1 is a cross section view of a semiconductor wafer illustrating the step of forming a transistor on a semiconductor substrate according to the present invention.

Referring to FIG. 1, a P type single crystal silicon substrate 2 with a <100> crystallographic orientation is provided. Then an isolation region 4 is formed using a suitable technique such as thick field oxide (FOX) or trench isolation technology. In the present invention, a thick field oxide (FOX) region 4 is formed to provide isolation between devices on the substrate 2. The FOX region 4 is created in a conventional manner. For example, the FOX region 4 can be formed via photolithography and dry etching steps to etch a silicon nitride-silicon dioxide composition layer. After the photoresist is removed and wet cleaned, thermal oxidation in an oxygen-steam environment is used to grow the FOX region 4 to a thickness of about 3000–8000 angstroms.

Next, a silicon dioxide layer 6 is created on the top surface of the substrate 2 to serve as the gate oxide for a subsequently formed Metal Oxide Silicon Field Effect Transistor (MOSFET). In one embodiment, the silicon dioxide layer 6 is formed by using an oxygen ambient, at a temperature of about 800° to 1100° C. Alternatively, the oxide layer may be formed using any suitable oxide chemical compositions and procedures. In the preferred embodiment, the thickness of the silicon dioxide layer 6 is approximately 30–200 angstroms.

A doped first polysilicon layer 8 is then formed over the FOX region 4 and the silicon dioxide layer 6 using a Low Pressure Chemical Vapor Deposition (LPCVD) process. In this embodiment, the first polysilicon layer 8 has a thickness of about 500–2000 angstroms. A capped oxide layer 10 is formed on the first polysilicon layer 8. Next, standard photolithography and etching steps are used to form a gate structure 12. Then LDD (lightly doped drain) structure 16 is formed by light ion implantation. Sidewall spacers 18 are generated by using well known technology. Subsequently, active regions 20 (i.e. the source and the drain) are formed by using well known processes to implant appropriate impurities in those regions. The MOSFET shown in FIG. 1 is well known in the art and various methods for making the same are known.

Figure 2:
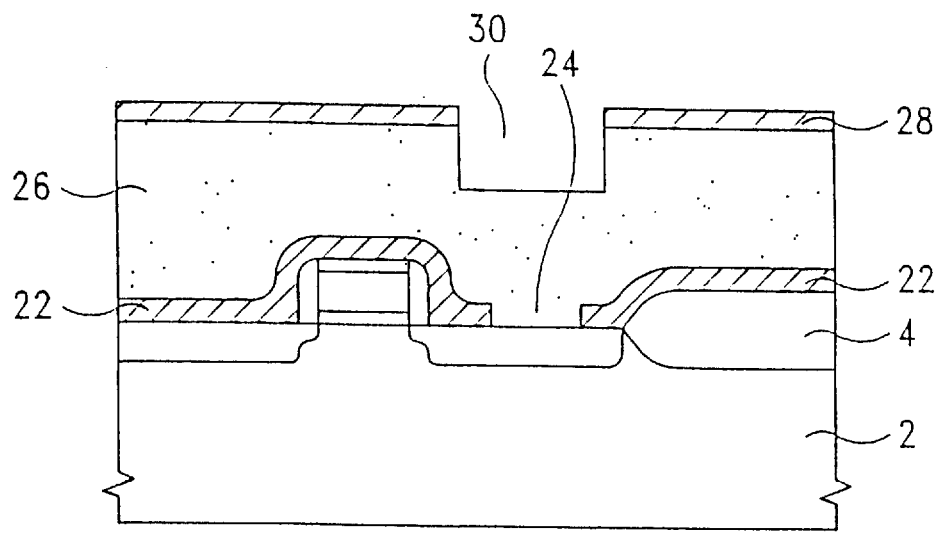
FIG. 2 is a cross section view of a semiconductor wafer illustrating the step of forming a nitride layer, a first polysilicon layer and forming a trench in the first polysilicon on the semiconductor substrate according to the present invention.

Turning next to FIG. 2, a first dielectric layer 22 is deposited by CVD on the gate structure 12 and the substrate 2 for isolation. The thickness of the layer 22 is about 1000–2500 angstroms. The first dielectric layer 22 can be formed by using suitable material such as an oxide. A contact window 24 is subsequently formed in the first dielectric layer 22 to the source 20 of the MOSFET by using well known photolithography and etching processes. A first conductive layer 26 is refilled into the contact window 24 and over the first dielectric layer 22. The first conductive layer 26 is preferably formed using conventional LPCVD processing. The thickness of the first conductive layer 26, as measured over the first dielectric layer 22, is optimally 3000–8000 angstroms. The first conductive layer 26 is preferably formed of in-situ doped polysilicon.

Subsequently, a silicon nitride layer 28 is formed on the first conductive layer 26. Preferably, the silicon nitride layer 28 is formed to have a thickness of about 300–1000 angstroms. Then, a photoresist is patterned on the silicon nitride layer 28, exposing a portion of the silicon nitride layer 28. The exposed silicon nitride layer 28 is over the contact window 24. An etching process is then carried out using the photoresist as an etching mask to etch the silicon nitride layer 28 and the polysilicon layer 26, thereby forming a trench 30 in the first polysilicon layer 26. Then, the photoresist is removed. In a preferred embodiment, the first polysilicon layer 26 can be etched by dry etching. Any suitable etchant can be used for this etching, such as $SF_6$, $CF_4+O_2$, $CF_4+Cl_2$, $CF_4+HBr$, $HBr/Cl_2/O_2$, $Cl_2$, $HBr/O_2$, $BCl_3/Cl_2$, $SiCl_4/Cl_2$, $SF_6$, $SF_6/Br_2$, $CCl_4/Cl_2$, or $CH_3F/Cl_2$.

Figure 3:
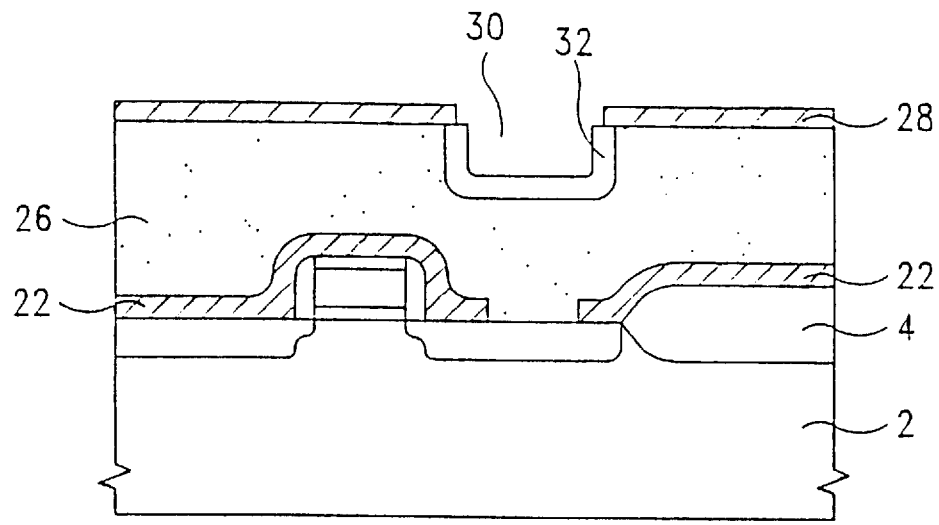
FIG. 3 is a cross section view of a semiconductor wafer illustrating the step of performing an oxidation according to the present invention.

Next, as shown in FIG. 3, a thermal oxidation is carried out in an oxygen ambient to oxidize the exposed first polysilicon layer 26 using the silicon nitride layer 28 as a mask. The first polysilicon layer 26 inside the trench 30 is converted into a silicon oxide layer 32. Typically, the temperature of the oxidation is about 700° to 900° C.

Figure 4:
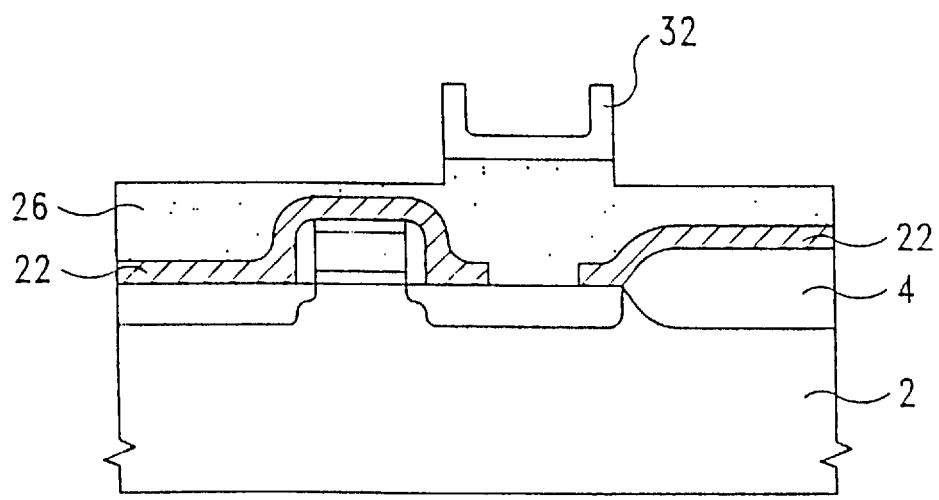
FIG. 4 is a cross section view of a semiconductor wafer illustrating the step of performing an etching to etch the silicon nitride and first polysilicon layer according to the present invention.

Next, as seen in FIG. 4, an etching is performed to remove the silicon nitride layer 28. Then, a portion of the first polysilicon layer 26 is etched by dry etching using the silicon oxide layer 30 as an etching mask. The present invention takes advantage of the high etching selectivity between silicon oxide layer 30 and polysilicon layer 26. The etchant can be chosen from the group of $SF_6$, $CF_4+O_2$, $CF_4+Cl_2$, $CF_4+HBr$, $HBr/Cl_2/O_2$, $Cl_2$, $HBr/O_2$, $BCl_3/Cl_2$, $SiCl_4/Cl_2$, $SF_6$, $SF_6/Br_2$, $CCl_4/Cl_2$, or $CH_3F/Cl_2$.

Figure 5:
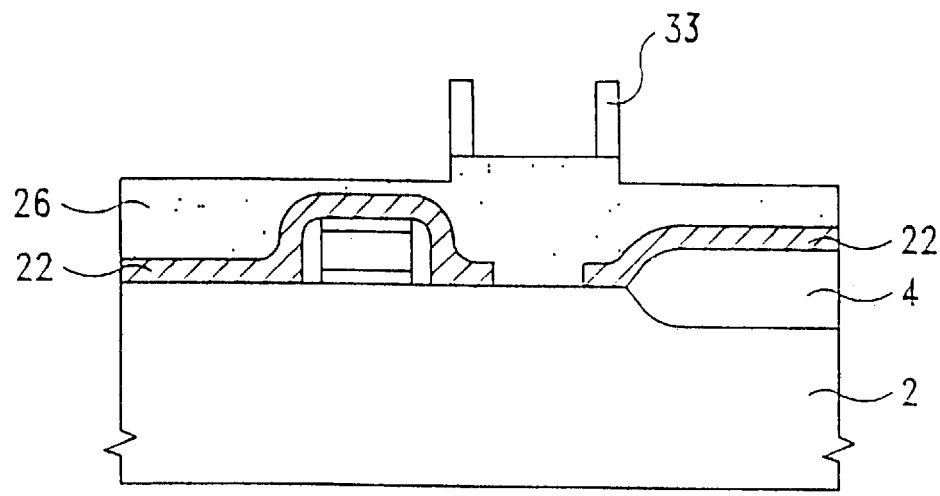
FIG. 5 is a cross section view of a semiconductor wafer illustrating the step of performing an anisotropic etching to etch the silicon oxide layer according to the present invention.

Turning to FIG. 5, anisotropic etching is performed to remove portions of the silicon oxide layer 30 until the surface of the first polysilicon layer 26 is reached. The cross section view of the resulting structure is two pillars 33 formed on the first conductive layer 26.

Figure 6:
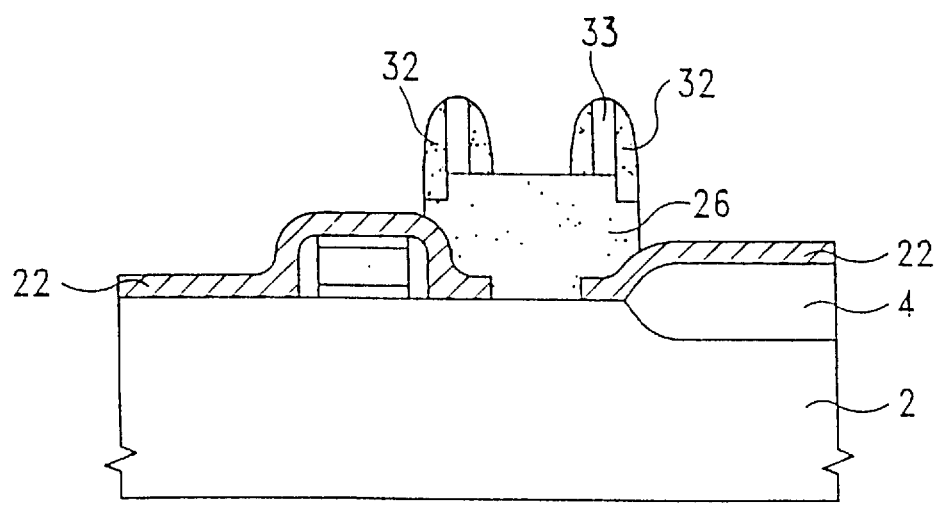
FIG. 6 is a cross section view of a semiconductor wafer illustrating the step of forming a polysilicon sidewall spacers on the sidewall of the silicon oxide layer according to the present invention.

Turning to FIG. 6, a second conductive layer 32 having a thickness of about 500 to 2000 angstroms is deposited using CVD on the surface of the first conductive layer 26 and the pillars 33. Preferably, the second conductive layer 32 is composed of doped polysilicon or in-situ doped polysilicon. Then, reactive ion etching (RIE) is used to anisotropically etch the second polysilicon layer 28 to form sidewall spacers on the side walls of the pillars 33. In a preferred embodiment, the etchant for this etching can be selected form the group of $SF_6$, $CF_4+O_2$, $CF_4+Cl_2$, $CF_4+HBr$, $HBr/Cl_2/O_2$, $Cl_2$, $HBr/O_2$, $BCl_3/Cl_2$, $SiCl_4/Cl_2$, $SF_6$, $SF_6/Br_2$, $CCl_4/Cl_2$, or $CH_3F/Cl_2$.

Figure 7:
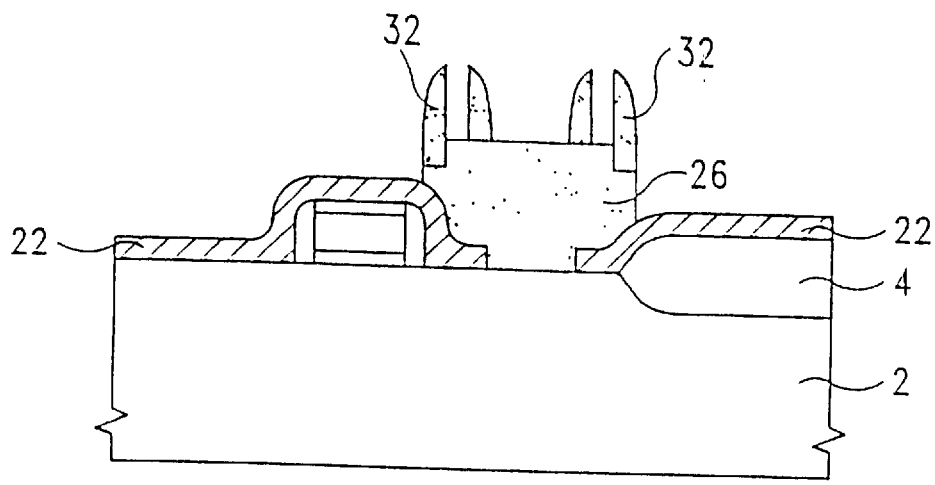
FIG. 7 is a cross section view of a semiconductor wafer illustrating the step of forming a bottom storage node of a capacitor.

Referring to FIG. 7, the pillars 33 are removed by using an HF solution or an MF vapor. Alternatively, a buffer oxide etchant can be also used as the etchant. The resulting structure consisting of first polysilicon layer 26 and the second polysilicon layer 32 serves as a bottom storage node of a capacitor.

Figure 8:
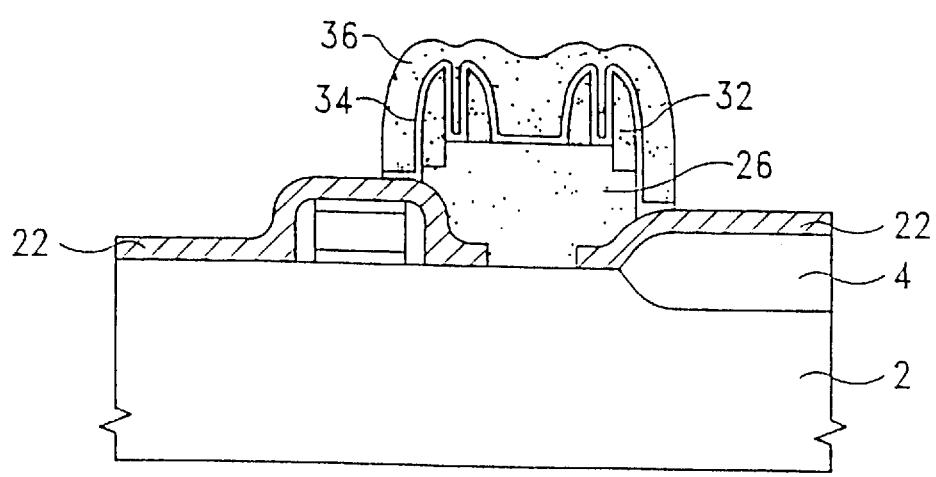
FIG. 8 is a cross section view of a semiconductor wafer illustrating the step of forming a second dielectric layer along the surface of the first conductive layer and forming a second conductive layer according to the present invention.

Turning now to FIG. 8, a second dielectric layer 34 is conformally deposited along the surface of the bottom storage node 26 and 32. The second dielectric layer 34 is preferably formed of either a double-film of nitride/oxide film, a triple-film of oxide/nitride/oxide, or any other high dielectric film such as tantalum oxide ($Ta_2O_5$). Finally, a third conductive layer 36 is deposited using a conventional LPCVD process over the second dielectric layer 34. The third conductive layer 36 serves as a top storage node and is formed of doped polysilicon, in-situ doped polysilicon, aluminum, copper, tungsten or titanium. An etching step is used to etch the second dielectric layer and the third polysilicon layer 36 for forming the top storage node of the capacitor.

The present invention thus provides capacitors with an enlarged surface area. Further, the high etching selectivity between silicon oxide and polysilicon is used to fabricate the capacitor. Moreover, the structure increases the surface area of the capacitor. Therefore the present invention increases the performance of the capacitor.

As will be understood by persons skilled in the art, the foregoing preferred embodiment of the present invention is illustrative of the present invention rather than limiting the present invention. For example, the method of the present invention can also be used in a COB (capacitor over bit line) structure. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a capacitor on a semiconductor substrate, said method comprising the steps of:

forming a first polysilicon layer over said substrate;

forming a first dielectric layer on said first polysilicon layer;

forming a trench in said first polysilicon layer and in said first dielectric layer;

thermally oxidizing said first polysilicon layer to form a silicon oxide layer along a surface of said trench using said first dielectric layer as a mask;

removing said first dielectric layer;

etching a portion of said first polysilicon layer using said silicon oxide layer as an etching mask;

anisotropically etching said silicon oxide layer to a surface of said first polysilicon layer;

forming a second polysilicon layer along the surface of said first polysilicon layer and said a surface of silicon oxide layer;

anisotropically etching said second polysilicon layer to form sidewall spacers on sidewalls of said silicon oxide layer;

removing said silicon oxide layer, thereby forming a first storage node of said capacitor;

forming a second dielectric layer on a surface of said first storage node of said capacitor; and forming a conductive layer along a surface of said second dielectric layer to act as a second storage node of said capacitor.

2. The method of claim 1, further including the steps of:

forming a third dielectric layer on said substrate; and forming a contact window in said third dielectric layer.

3. The method of claim 1, wherein said first polysilicon layer is formed of in-situ doped polysilicon.

4. The method of claim 3, wherein said first polysilicon layer has a thickness in a range of about 3000–8000 angstroms.

5. The method of claim 1, wherein said second polysilicon layer is formed of in-situ doped polysilicon.

6. The method of claim 5, wherein said second polysilicon layer has a thickness in a range of about 500–2000 angstroms.

7. The method of claim 1, wherein a temperature of said oxidation is about 700°–900° C.

8. The method of claim 1, wherein an etchant of said etching to etch a portion of said first polysilicon layer is selected from the group consisting of $SF_6$, $CF_4+O_2$, $CF_4+Cl_2$, $CF_4+HBr$, $HBr/Cl_2/O_2$, $Cl_2$, $HBr/O_2$, $BCl_3/Cl_2$, $SiCl_4/Cl_2$, $SF_6$, $SF_6/Br_2$, $CCl_4/Cl_2$, and $CH_3F/Cl_2$.

9. The method of claim 1, wherein said silicon oxide layer is removed by using HF solution.

10. The method of claim 1, wherein said silicon oxide layer is removed by using HF vapor.

11. The method of claim 1, wherein said second dielectric layer is formed of tantalum oxide($Ta_2O_5$).

12. The method of claim 1, wherein said second dielectric layer is formed of a triple film of oxide/nitride/oxide.

13. The method of claim 1, wherein said dielectric layer is formed of a double film of nitride/oxide film.

14. A method of forming a silicon structure, said method comprising the steps of:

forming a first polysilicon layer over a substrate;

forming a first dielectric layer on said first polysilicon layer;

forming a trench in said first polysilicon layer and in said first dielectric layer;

performing a thermal oxidation to said first polysilicon layer in an oxygen ambient to form a silicon oxide layer along a surface of said trench using said first dielectric layer as a mask;

removing said first dielectric layer;

etching a portion of said first polysilicon layer using said silicon oxide layer as an etching mask;

anisotropically etching said silicon oxide layer to a surface of said first polysilicon layer;

forming a second polysilicon layer along the surface of said first polysilicon layer and a surface of said silicon oxide layer;

anisotropically etching said second polysilicon layer to form sidewall spacers on sidewalls of said silicon oxide layer; and removing said silicon oxide layer, thereby forming a first storage node of a capacitor.

15. The method of claim 14, wherein said first polysilicon layer is selected from the group consisting of doped polysilicon and in-situ doped polysilicon.

16. The method of claim 15, wherein said second polysilicon layer is selected from the group consisting of doped polysilicon and in-situ doped polysilicon.

17. The method of claim 14, wherein a temperature of said oxidation is about 700°–900° C.

18. The method of claim 14, wherein said silicon oxide layer is removed by using HF solution.

19. The method of claim 14, wherein said silicon oxide layer is removed by using HF vapor.

* * * * *